United States Patent
Liu et al.

(10) Patent No.: US 9,559,237 B2
(45) Date of Patent: Jan. 31, 2017

(54) OPTOELECTRIC DEVICES COMPRISING HYBRID METAMORPHIC BUFFER LAYERS

(71) Applicant: The Boeing Company, Seal Beach, CA (US)

(72) Inventors: Xing-Quan Liu, Arcadia, CA (US); Christopher M. Fetzer, Valencia, CA (US); Daniel C. Law, Arcadia, CA (US); Richard R. King, Thousand Oaks, CA (US)

(73) Assignee: THE BOEING COMPANY, Chicago, IL (US)

( * ) Notice: Subject to any disclaimer, the term of this patent is extended or adjusted under 35 U.S.C. 154(b) by 512 days.

(21) Appl. No.: 13/860,400

(22) Filed: Apr. 10, 2013

(65) Prior Publication Data

US 2014/0305498 A1    Oct. 16, 2014

(51) Int. Cl.
*H01L 31/0687* (2012.01)
*H01L 31/18* (2006.01)
*H01L 31/0392* (2006.01)

(52) U.S. Cl.
CPC ..... *H01L 31/06875* (2013.01); *H01L 31/1844* (2013.01); *H01L 31/0392* (2013.01); *Y02E 10/544* (2013.01); *Y02P 70/521* (2015.11)

(58) Field of Classification Search
CPC .......... H01L 31/0392; H01L 31/06875; H01L 31/1844
See application file for complete search history.

(56) References Cited

U.S. PATENT DOCUMENTS 5,747,861 A * 5/1998 Dentai .......................... 257/435
2010/0122724 A1* 5/2010 Cornfeld et al. ............. 136/255
(Continued)

FOREIGN PATENT DOCUMENTS

JP    2009-141135 A    6/2009

OTHER PUBLICATIONS

European Search Report dated May 13, 2014 for European Application No. 14 158 940.8, 10 pages.
(Continued)

*Primary Examiner* — Allison Bourke
*Assistant Examiner* — Edward Schmiedel
(74) *Attorney, Agent, or Firm* — Smith Moore Leatherwood LLP

(57) ABSTRACT

In one aspect, semiconductor structures are described herein. A semiconductor structure, in some implementations, comprises a first semiconductor layer having a first bandgap and a first lattice constant and a second semiconductor layer having a second bandgap and a second lattice constant. The second lattice constant is lower than the first lattice constant. Additionally, a transparent metamorphic buffer layer is disposed between the first semiconductor layer and the second semiconductor layer. The buffer layer has a constant or substantially constant bandgap and a varying lattice constant. The varying lattice constant is matched to the first lattice constant adjacent the first semiconductor layer and matched to the second lattice constant adjacent the second semiconductor layer. The buffer layer comprises a first portion comprising $Al_yGa_zIn_{(1-y-z)}As$ and a second portion comprising $Ga_xIn_{(1-x)}P$. The first portion is adjacent the first semiconductor layer and the second portion is adjacent the second semiconductor layer.

29 Claims, 2 Drawing Sheets

(56) References Cited

U.S. PATENT DOCUMENTS

2010/0229926 A1    9/2010  Newman et al.
2012/0211068 A1*   8/2012  Cornfeld et al. ............. 136/255

OTHER PUBLICATIONS

King et al., "Solar Cell Generations Over 40% Efficiency," 26th European Photovoltaic Solar Energy Conference and Exhibition, May 7, 2012, pp. 1-15.
Patel et al., "Experimental Results From Performance Improvement and Radiation Hardening of Inverted Metamorphic Multijunction Solar Cells," IEEE Journal of Photovoltaics, vol. 2, No. 3, Jun. 18, 2012; pp. 377-381.
Zakaria et al., "Comparison of arsenide and phosphide based graded buffer layers used in inverted metamorphic solar cells," Journal of Applied Physics, vol. 112, No. 2, Jul. 23, 2012; 8 pages.
Geisz et al., "High-efficiency GaInP/GaAs/InGaAs triple-junction solar cells grown inverted with a metamorphic bottom junction," copyright 2007, American Institute of Physics, Applied Physics Letters 91, 023502 (2007), 3 pages.
Geisz et al., "In situ stress measurement for MOVPE growth of high efficiency lattice-mismatched solar cells," copyright 2007, Journal of Crystal Growth 310 (2008), pp. 2339-2344.

* cited by examiner

OPTOELECTRIC DEVICES COMPRISING HYBRID METAMORPHIC BUFFER LAYERS

STATEMENT REGARDING FEDERALLY SPONSORED RESEARCH

This invention was made with government support under contract numbers FA9453-04-2-0042 and FA9453-09-C-0373 awarded by the U.S. Air Force Research Laboratory. The government has certain rights in the invention.

FIELD

This disclosure relates to optoelectronic devices and, in particular, to inverted metamorphic multijunction solar cells.

BACKGROUND

In some cases, multijunction solar cells can exhibit high conversion efficiencies relative to single junction solar cells. However, to achieve highly efficient multijunction solar cells, the use of low bandgap subcells such as 1.0 eV and 0.68 eV subcells can be important. Some multijunction solar cells can exhibit a large lattice mismatch between the substrate and the semiconductor layers of one or more subcells of the multijunction device, especially low bandgap subcells. For this reason a step graded buffer layer is sometimes used to connect subcells having large lattice mismatches. Unfortunately, some existing buffer layers require high thermal loads during manufacture. High thermal loads can degrade the performance of the resulting solar cell in operation.

Therefore, there exists a need for improved semiconductor structures, devices, and manufacturing methods that can provide multijunction solar cells having higher efficiencies than some existing multijunction cells.

SUMMARY

In one aspect, semiconductor structures are described herein which, in some implementations, may provide one or more advantages over previous semiconductor structures. For example, in some implementations, a semiconductor structure described herein exhibits improved efficiency and/or reduced thermal load compared to some other semiconductor structures.

In some implementations, a semiconductor structure described herein comprises a first semiconductor layer having a first bandgap and a first lattice constant and a second semiconductor layer having a second bandgap and a second lattice constant. The second lattice constant is lower than the first lattice constant. In addition, a transparent metamorphic buffer layer is disposed between the first semiconductor layer and the second semiconductor layer. The buffer layer has a constant or substantially constant bandgap and a varying lattice constant. Moreover, the varying lattice constant is matched to the first lattice constant adjacent the first semiconductor layer and matched to the second lattice constant adjacent the second semiconductor layer. Further, the buffer layer comprises a first portion comprising or composed of $Al_yGa_zIn_{(1-y-z)}As$ and a second portion comprising or composed of $Ga_xIn_{(1-x)}P$. The first portion is adjacent the first semiconductor layer and forms between about 2 percent and about 50 percent of the total thickness of the buffer layer. The second portion is adjacent the second semiconductor layer and forms between about 50 percent and about 98 percent of the total thickness of the buffer layer.

Additionally, in some implementations, a semiconductor structure described herein further comprises a third semiconductor layer and a second transparent metamorphic buffer layer disposed between the second semiconductor layer and the third semiconductor layer. The third semiconductor layer has a third bandgap and a third lattice constant, the third lattice constant being lower than the second lattice constant. The second buffer layer has a constant or substantially constant bandgap and a varying lattice constant, the varying lattice constant being matched to the second lattice constant adjacent the second semiconductor layer and matched to the third lattice constant adjacent the third semiconductor layer. In some instances, the second metamorphic layer comprises or is formed from $Ga_xIn_{(1-x)}P$ or $Al_xIn_yGa_{(1-x-y)}As$.

Moreover, in some implementations, a semiconductor structure described herein further comprises a fourth semiconductor layer having a fourth bandgap and a fourth lattice constant. Further, one or more of the first, second, third, and fourth semiconductor layers of a semiconductor structure described herein can comprise a base portion and an emitter portion, the base portion and emitter portion forming a p-n junction. Thus, in some implementations, a semiconductor structure described herein can be a multijunction structure, including a 4-junction structure. Other multijunction structures are also possible. In addition, in some implementations, a semiconductor structure described herein is an inverted metamorphic structure.

In another aspect, optoelectronic devices are described herein which, in some implementations, may provide one or more advantages over some other devices. In some implementations, for instance, a device described herein exhibits higher efficiency and/or reduced thermal load compared to some other devices. In some implementations, an optoelectronic device described herein comprises a semiconductor structure described herein. For example, in some instances, an optoelectronic device comprises a first subcell comprising a first semiconductor layer having a first bandgap and a first lattice constant and a second subcell comprising a second semiconductor layer having a second bandgap and a second lattice constant. The second lattice constant is lower than the first lattice constant. In addition, a transparent metamorphic buffer layer is disposed between the first semiconductor layer of the first subcell and the second semiconductor layer of the second subcell. The buffer layer has a constant or substantially constant bandgap and a varying lattice constant. The varying lattice constant of the buffer layer is matched to the first lattice constant adjacent the first semiconductor layer and matched to the second lattice constant adjacent the second semiconductor layer. Further, the buffer layer comprises a first portion comprising or composed of $Al_yGa_zIn_{(1-y-z)}As$ and a second portion comprising or composed of $Ga_xIn_{(1-x)}P$. The first portion is adjacent the first semiconductor layer and forms between about 2 percent and about 50 percent of the total thickness of the buffer layer. The second portion is adjacent the second semiconductor layer and forms between about 50 percent and about 98 percent of the total thickness of the buffer layer. Moreover, in some implementations, the buffer layer is transparent to electromagnetic radiation absorbable by the second subcell.

Additionally, in some implementations of optoelectronic devices described herein, the device further comprises a third subcell. The third subcell comprises a third semiconductor layer having a third bandgap and a third lattice constant, the third lattice constant being lower than the second lattice constant. In addition, the device can comprise a second transparent metamorphic buffer layer disposed between the second semiconductor layer and the third semiconductor layer. The second buffer layer, if desired, can have a structure that is similar or analogous to the structure of another buffer layer described herein. For example, in some instances, the second buffer layer has a constant or substantially constant bandgap and a varying lattice constant. The varying lattice constant is matched to the second lattice constant adjacent the second semiconductor layer and matched to the third lattice constant adjacent the third semiconductor layer.

Similarly, in still other implementations, a device described herein can further comprise a fourth subcell. The fourth subcell comprises a fourth semiconductor layer having a fourth bandgap and a fourth lattice constant. Further, one or more of the first, second, third, and fourth semiconductor layers of the first, second, third, and fourth subcells, respectively, can comprise a base portion and an emitter portion, the base portion and emitter portion forming a p-n junction. Thus, in some implementations, an optoelectronic device described herein can be a multijunction device, including a 4-junction device such as a 4-junction solar cell. Other multijunction devices are also contemplated. In addition, in some implementations, a multijunction device described herein is an inverted metamorphic device, such as an inverted metamorphic solar cell.

In another aspect, methods of making an optoelectronic device are described herein which, in some implementations, may provide one or more advantages over some prior methods. In some implementations, for example, a method described herein can provide an optoelectronic device with reduced thermal load. Further, a method described herein can be used to form any optoelectronic device described herein. A method of making an optoelectronic device described herein, in some implementations, comprises providing a substrate, disposing a first subcell comprising a first semiconductor layer above the substrate, disposing a second subcell comprising a second semiconductor layer above the substrate, and disposing a transparent metamorphic buffer layer between the first semiconductor layer and the second semiconductor layer. The first semiconductor layer has a first bandgap and a first lattice constant. The second semiconductor layer has a second bandgap and a second lattice constant, the second lattice constant being lower than the first lattice constant. Further, the first subcell is stacked above the second subcell and positioned farther from the substrate than the second subcell is from the substrate.

The transparent metamorphic buffer layer has a constant or substantially constant bandgap and a varying lattice constant, the varying lattice constant being matched to the first lattice constant adjacent the first semiconductor layer and matched to the second lattice constant adjacent the second semiconductor layer. Moreover, the buffer layer comprises a first portion comprising or composed of $Al_{y}Ga_{z}In_{(1-y-z)}As$ and a second portion comprising or composed of $Ga_{x}In_{(1-x)}P$. The first portion is adjacent the first semiconductor layer and forms between about 2 percent and about 50 percent of the total thickness of the buffer layer, and the second portion is adjacent the second semiconductor layer and forms between about 50 percent and about 98 percent of the total thickness of the buffer layer.

In addition, in some implementations, a method described herein further comprises disposing a third subcell above the substrate and below the second subcell. The third subcell comprises a third semiconductor layer having a third bandgap and a third lattice constant, the third lattice constant being lower than the second lattice constant. In some cases, a method described herein further comprises disposing a second transparent metamorphic buffer layer between the second semiconductor layer and the third semiconductor layer. The buffer layer has a constant or substantially constant bandgap and a varying lattice constant. The varying lattice constant is matched to the second lattice constant adjacent the second semiconductor layer and matched to the third lattice constant adjacent the third semiconductor layer.

Further, in some cases, a method described herein also comprises disposing a fourth subcell above the substrate and below the third subcell. The fourth subcell can comprise a fourth semiconductor layer having a fourth bandgap and a fourth lattice constant, the fourth lattice constant being lower than or the same or substantially the same as the third lattice constant. In addition, in some implementations, one or more additional subcells are also provided. Thus, a method described herein can be used to make a multijunction device having any desired number of subcells, such as a 4-junction, 5-junction, 6-junction, or 7-junction device.

These and other implementations are described in greater detail in the detailed description which follows.

DETAILED DESCRIPTION

Figure 1:
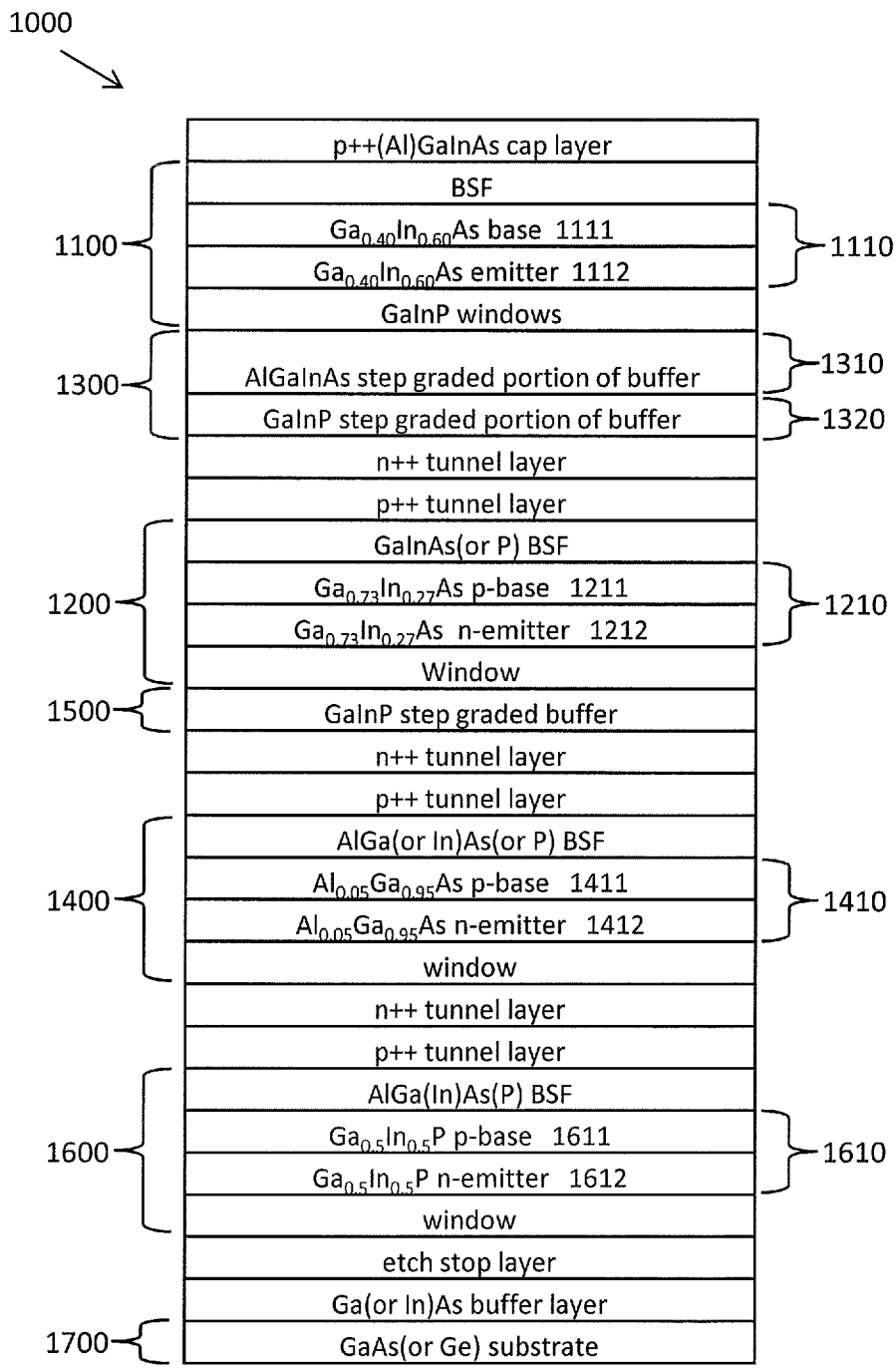
FIG. 1 illustrates a sectional view of an optoelectronic device according to one implementation described herein.

Implementations described herein can be understood more readily by reference to the following detailed description, examples, and drawings. Elements, apparatus, and methods described herein, however, are not limited to the specific implementations presented in the detailed description, examples, and drawings. It should be recognized that these implementations are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

Further, when the phrase "up to" is used in connection with an amount, it is to be understood that the amount is at least a detectable amount. For example, a material present in an amount "up to" a specified amount can be present from a detectable amount and up to and including the specified amount.

A "lattice constant," for reference purposes herein, comprises an unstrained lattice constant at a temperature of 300 K. Moreover, in the case of semiconductor materials having a cubic crystal structure such as a zinc blende crystal structure, the lattice constant comprises the lattice parameter $a_0$. In the case of semiconductor materials having a non-cubic crystal structure such as a hexagonal or wurtzite crystal structure, the lattice constant comprises the lattice parameter a or the equivalent lattice parameter b.

Further, "lattice matched" materials, for reference purposes herein, have the same lattice constant or the same lattice constant within about 0.01%, the percent being based on the larger lattice constant as the denominator.

Similarly, "lattice mismatched" materials or layers, for reference purposes herein, have different lattice constants or substantially different lattice constants, where substantially different lattice constants differ by more than about 0.01% or more than about 0.1%. The difference between the lattice constants of two materials or layers can be referred to as the "lattice mismatch" of the materials or layers. The lattice mismatch can be expressed as a percent, based on the difference between the lattice constants being the numerator, and the larger lattice constant being the denominator, as understood by one of ordinary skill in the art.

In addition, a "substantially constant bandgap," for reference purposes herein, comprises a bandgap that varies by less than about 10 percent, less than about 5 percent, less than about 1 percent, or less than about 0.1 percent across the thickness of a layer, such as the thickness of a buffer layer described herein.

A "transparent" material or layer, for reference purposes herein, comprises a material or layer having a higher bandgap than adjacent semiconductor layers. For example, a transparent buffer layer disposed between a first semiconductor layer and a second semiconductor layer has a higher bandgap than both the first and second semiconductor layers.

Moreover, a "metamorphic" layer, for reference purposes herein, comprises a layer wherein the strain is at least about 30% relaxed. In some implementations, a metamorphic layer is a compositionally step-graded layer, including a layer compositionally graded in small steps or layers, such as steps or layers of about 0.1 µm to about 0.5 µm in thickness. A "compositionally step-graded layer," for reference purposes herein, is a layer comprising or formed from a plurality of compositionally graded steps or layers of material, where the compositionally graded steps have differing chemical compositions. The differing chemical compositions of the plurality of compositionally graded steps can exhibit an overall compositional gradient, such as a gradient of increasing or decreasing amounts of one or more elements. For example, in some implementations, the Al content of the steps of a step-graded layer can increase from the bottom of the layer to the top of the layer, and/or the Ga content of the steps of a step-graded layer can decrease from the bottom of the layer to the top of the layer. More generally, for illustration purposes herein, a compositionally step-graded layer having a quaternary structure $A_aB_bC_cD_d$ can comprise a plurality of compositionally graded steps having the chemical composition $A_aB_bC_cD_d$, wherein one or more of a, b, c, and d increases or decreases from step to step across the layer.

Further, the "top" semiconductor layer or subcell of a semiconductor structure or device, for reference purposes herein, comprises the layer or subcell of the semiconductor structure or device that is closest to the source of incident electromagnetic radiation during normal operation and orientation of the structure or device. Thus, the "top" layer or subcell can also be referred to as the most "sunward" layer or subcell.

Similarly, the "bottom" semiconductor layer or subcell of a semiconductor structure or device, for reference purposes herein, comprises the layer or subcell of the semiconductor structure or device that is farthest from the source of incident electromagnetic radiation during normal operation and orientation of the structure or device. Thus, the "bottom" layer or subcell can also be referred to as the layer or subcell on the opposite side of the structure or device from the sunward layer or subcell.

I. Semiconductor Structures

In one aspect, semiconductor structures are described herein. In some implementations, a semiconductor structure described herein comprises a first semiconductor layer having a first bandgap and a first lattice constant and a second semiconductor layer having a second bandgap and a second lattice constant. The second lattice constant is lower than the first lattice constant. Additionally, in some cases, the first bandgap and the second bandgap are different. For example, in some cases, the second bandgap is higher than the first bandgap.

The semiconductor structure further comprises a transparent metamorphic buffer layer disposed between the first semiconductor layer and the second semiconductor layer, the buffer layer having a constant or substantially constant bandgap and a varying lattice constant. The varying lattice constant is matched to the first lattice constant adjacent the first semiconductor layer and is matched to the second lattice constant adjacent the second semiconductor layer.

The buffer layer comprises a first portion comprising or composed of $Al_yGa_zIn_{(1-y-z)}As$ and a second portion comprising or composed of $Ga_xIn_{(1-x)}P$, wherein, in some cases, x can be zero and/or (y+z) can be 1. The first portion is adjacent the first semiconductor layer and forms between about 2 percent and about 50 percent of the total thickness of the buffer layer, and the second portion is adjacent the second semiconductor layer and forms between about 50 percent and about 98 percent of the total thickness of the buffer layer. In some cases, the first portion of a buffer layer described herein forms between about 5 percent and about 40 percent of the total thickness of the buffer layer. In other instances, the first portion of the buffer layer forms between about 10 percent and about 40 percent, between about 15 percent and about 35 percent, between about 20 percent and about 40 percent, or between about 30 percent and about 35 percent of the total thickness of the buffer layer.

Moreover, the total thickness of the buffer layer, in some implementations, is the thickness of the first portion of the buffer layer plus the thickness of the second portion of the buffer layer. Additionally, the total thickness, in some cases, is less than about 20 µm, less than about 15 µm, less than about 10 µm, or less than about 5 µm. The total thickness can also be between about 1 µm and about 20 µm, between about 1 µm and about 15 µm, between about 1 µm and about 10 µm, or between about 3 µm and about 5 µm.

Further, in some cases, the first portion of a buffer layer described herein can compensate for at least about 3 percent of the lattice mismatch between the first lattice constant of the first semiconductor layer and the second lattice constant of the second semiconductor layer. In some implementations, the first portion compensates for at least about 10 percent, at least about 20 percent, or at least about 30 percent of the lattice mismatch between the first lattice constant and the second lattice constant. In other instances, the first portion of the buffer layer compensates for up to about 50 percent, up to about 30 percent, up to about 20 percent, or up to about 10 percent of the lattice mismatch between the first lattice constant and the second lattice constant. In some cases, the first portion of the buffer layer compensates for between about 3 percent and about 50 percent, between about 10 percent and about 40 percent, or between about 15 percent and about 30 percent of the lattice mismatch between the first lattice constant and the second lattice constant.

In addition, in some implementations, the chemical composition of a metamorphic buffer layer described herein can vary within the layer. For example, in some cases, the In content of a first portion of the buffer layer increases from the second semiconductor layer to the first semiconductor layer. Further, in some implementations having such a composition, the Al content of the first portion of the buffer layer also increases from the second semiconductor layer to the first semiconductor layer. Moreover, it is also possible for the bandgap of the first portion of a buffer layer having such a configuration to be constant or substantially constant throughout the compositional gradient.

Similarly, in some cases, a first portion of a buffer layer described herein can comprise a plurality of compositionally graded steps comprising or composed of $Al_yGa_zIn_{(1-y-z)}As$ and a second portion of the buffer layer can comprise a plurality of compositionally graded steps comprising or composed of $Ga_xIn_{(1-x)}P$. In some implementations, x can be zero and/or (y+z) can be 1. In other instances, x is non-zero and/or (y+z) is less than 1. In some cases, one of the plurality of $Al_yGa_zIn_{(1-y-z)}As$ steps is immediately adjacent one of the plurality of $Ga_xIn_{(1-x)}P$ steps, and the immediately adjacent $Al_yGa_zIn_{(1-y-z)}As$ and $Ga_xIn_{(1-x)}P$ steps have the same lattice constant. Further, in some cases, one or both of the immediately adjacent $Al_yGa_zIn_{(1-y-z)}As$ and $Ga_xIn_{(1-x)}P$ steps has a thickness of at least about 0.2 µm. Other thicknesses are also possible. For instance, in some implementations, one or both of the immediately adjacent $Al_yGa_zIn_{(1-y-z)}As$ and $Ga_xIn_{(1-x)}P$ steps has a thickness of at least about 0.4 µm or a thickness between about 0.2 µm and about 10 µm or between about 0.2 µm and about 1 µm. In addition, in some implementations, the second portion of the buffer layer comprises a $Ga_xIn_{(1-x)}P$ step having a lattice constant greater than the lattice constant of the immediately adjacent $Al_yGa_zIn_{(1-y-z)}As$ and $Ga_xIn_{(1-x)}P$ steps. Further, this $Ga_xIn_{(1-x)}P$ step can be positioned closer to the second semiconductor layer than the immediately adjacent $Al_yGa_zIn_{(1-y-z)}As$ and $Ga_xIn_{(1-x)}P$ steps are. Moreover, in some implementations, a $Ga_xIn_{(1-x)}P$ step having a lattice constant greater than the lattice constant of the immediately adjacent $Al_yGa_zIn_{(1-y-z)}As$ and $Ga_xIn_{(1-x)}P$ steps and positioned closer to the second semiconductor layer than the immediately adjacent $Al_yGa_zIn_{(1-y-z)}As$ and $Ga_xIn_{(1-x)}P$ steps is an InP step. Further, in some cases, the smallest lattice constant present in the first portion of a buffer layer described herein is less than or equal to the lattice constant of InP.

In some instances, it is also possible that the second portion of a buffer layer described herein comprises Al. For example, in some implementations, the second portion of a buffer layer described herein comprises or is formed from $Al_aGa_bIn_{(1-a-b)}P$, wherein a is non-zero. Further, the amount of Al in the second portion of the buffer layer, in some cases, can be less than about 5 atom percent or less than about 2 atom percent, based on the total amount of Group III elements. For example, a can be between about 0.001 and about 0.02.

Thus, in some such implementations, a first portion of a buffer layer described herein can comprise a plurality of compositionally graded steps comprising or composed of $Al_yGa_zIn_{(1-y-z)}As$ and a second portion of the buffer layer can comprise a plurality of compositionally graded steps comprising or composed of $Al_aGa_bIn_{(1-a-b)}P$. In some implementations, b can be zero and/or (y+z) can be 1. In other instances, b is non-zero and/or (y+z) is less than 1. In some cases, one of the plurality of $Al_yGa_zIn_{(1-y-z)}As$ steps is immediately adjacent one of the plurality of $Al_aGa_bIn_{(1-a-b)}P$ steps, and the immediately adjacent $Al_yGa_zIn_{(1-y-z)}As$ and $Al_aGa_bIn_{(1-a-b)}P$ steps have the same lattice constant. Further, in some cases, one or both of the immediately adjacent $Al_yGa_zIn_{(1-y-z)}As$ and $Al_aGa_bIn_{(1-a-b)}P$ steps has a thickness of at least about 0.2 µm. Other thicknesses are also possible. For instance, in some implementations, one or both of the immediately adjacent $Al_yGa_zIn_{(1-y-z)}As$ and $Al_aGa_bIn_{(1-a-b)}P$ steps has a thickness of at least about 0.4 µm or a thickness between about 0.2 µm and about 10 µm or between about 0.2 µm and about 1 µm. In addition, in some implementations, the second portion of the buffer layer comprises a $Al_aGa_bIn_{(1-a-b)}P$ step having a lattice constant greater than the lattice constant of the immediately adjacent $Al_yGa_zIn_{(1-y-z)}As$ and $Al_aGa_bIn_{(1-a-b)}P$ steps. Further, this $Al_aGa_bIn_{(1-a-b)}P$ step can be positioned closer to the second semiconductor layer than the immediately adjacent $Al_yGa_zIn_{(1-y-z)}As$ and $Al_aGa_bIn_{(1-a-b)}P$ steps are. Moreover, in some implementations, a $Al_aGa_bIn_{(1-a-b)}P$ step having a lattice constant greater than the lattice constant of the immediately adjacent $Al_yGa_zIn_{(1-y-z)}As$ and $Al_aGa_bIn_{(1-a-b)}P$ steps and positioned closer to the second semiconductor layer than the immediately adjacent $Al_yGa_zIn_{(1-y-z)}As$ and $Al_aGa_bIn_{(1-a-b)}P$ steps is an InP step. Further, in some cases, the smallest lattice constant present in the first portion of a buffer layer described herein is less than or equal to the lattice constant of InP.

Surprisingly, it has been found that a metamorphic buffer layer having a composition and structure described herein, in some implementations, can provide a semiconductor structure exhibiting high external quantum efficiency.

Further, a semiconductor structure described herein can also comprise one or more layers in addition to those already described, such as one more additional semiconductor layers and/or one or more additional metamorphic buffer layers. For example, in some implementations, a semiconductor structure described herein further comprises a third semiconductor layer and a second transparent metamorphic buffer layer disposed between the second semiconductor layer and the third semiconductor layer. The third semiconductor layer has a third bandgap and a third lattice constant, the third lattice constant of the third semiconductor layer being lower than the second lattice constant of the second semiconductor layer. In addition, in some cases, the third bandgap is higher than the second bandgap.

The second buffer layer has a constant or substantially constant bandgap and a varying lattice constant, the varying lattice constant being matched to the second lattice constant adjacent the second semiconductor layer and matched to the third lattice constant adjacent the third semiconductor layer. Further, the second metamorphic layer can comprise or be formed from any material not inconsistent with the objectives of the present disclosure. In some instances, for example, the second metamorphic layer comprises or is formed from $Ga_xIn_{(1-x)}P$ or $Al_aGa_bIn_{(1-a-b)}P$ or $Al_xIn_yGa_{(1-x-y)}As$. In some cases, the second metamorphic buffer layer can have a composition similar or analogous to the first metamorphic buffer layer.

Moreover, in some implementations, a semiconductor structure described herein further comprises a fourth semiconductor layer having a fourth bandgap and a fourth lattice constant. Further, one or more of the first, second, third, and fourth semiconductor layers of a semiconductor structure described herein can comprise a base portion and an emitter portion, the base portion and emitter portion forming a p-n junction. Thus, in some implementations, a semiconductor structure described herein can be a multijunction structure, including a 4-junction structure. Other multijunction structures are also possible. For instance, any number of semiconductor layers described herein can be used to form any number of junctions not inconsistent with the objectives of the present disclosure. Thus, if desired, a semiconductor structure described herein can be a 3-junction, 4-junction, 5-junction, 6-junction, or 7-junction semiconductor structure. In addition, in some implementations, a semiconductor structure described herein is an inverted metamorphic structure.

Further, semiconductor layers of a semiconductor structure described herein can comprise or be formed from any materials and can have any bandgap not inconsistent with the objectives of the present disclosure. In some implementations, one or more semiconductor layers described herein comprise or are formed from a III-V material, including a binary, ternary, quarternary, or quinary material. A semiconductor layer described herein can also comprise or be formed from a II-VI material or a Group IV material. Further, semiconductor layers described herein may also include one or more metals, including one or more transition metals. Non-limiting examples of materials suitable for use in some implementations described herein include AlP, GaP, InP, AlGaP, GaInP, AlInP, AlGaInP, AlAs, GaAs, InAs, AlGaAs, GaInAs, AlInAs, AlGaInAs, AlPAs, GaPAs, InPAs, AlGaPAs, GaInPAs, AlInPAs, AlGaInPAs, AlNAs, GaNAs, InNAs, AlGaNAs, GaInNAs, AlInNAs, AlGaInNAs, AlNAsSb, GaNAsSb, InNAsSb, AlGaNAsSb, GaInNAsSb, AlInNAsSb, AlGaInNAsSb, AlNP, GaNP, InNP, AlGaNP, GaInNP, AlInNP, AlGaInNP, GaInNPAs, GaInNPAsSb, AlGaInNPAsSb, AlN, GaN, InN, AlGaN, GaInN, AlInN, AlGaInN, AlSb, GaSb, InSb, AlGaSb, GaInSb, AlInSb, AlGaInSb, AlAsSb, GaAsSb, InAsSb, AlGaAsSb, GaInAsSb, AlInAsSb, AlGaInAsSb, AlPAsSb, GaPAsSb, InPAsSb, AlGaPAsSb, GaInPAsSb, AlInPAsSb, AlGaInPAsSb, C, Si, Ge, SiGe, SiSn, GeSn, SiGeSn, CSi, CGe, CSn, CSiGe, CGeSn, CSiSn, CSiGeSn, ZnO, CdO, ZnS, CdS, ZnSe, CdSe, ZnTe, CdTe, CuGaS, CuInS, CuGaInS, CuGaSe, CuInSe, CuGaInSe, CuGaSSe, CuInSSe, CuGaInSSe. In some implementations, for example, the first semiconductor layer and/or the second semiconductor layer of a semiconductor structure described herein comprises or is formed from $Ga_xIn_{(1-x)}As$.

Additionally, in some cases, the chemical composition of a semiconductor layer described herein is selected based on a desired bandgap of the layer. For instance, the chemical composition of a $Ga_xIn_{(1-x)}As$ semiconductor layer can be selected based on the empirically derived relationship between the bandgap ($E_g$, in units of eV) and (1−x), as described by equation (1):

$$E_g((1-x))=0.413(1-x)^2-1.469(1-x)+1.415 \quad (1).$$

Moreover, any combination of bandgaps not inconsistent with the objectives of the present disclosure can be used in a semiconductor structure described herein. In some implementations, the bandgaps of the semiconductor layers are arranged in order of increasing bandgap, moving from the top to the bottom of the structure. Alternatively, in other cases, the bandgaps are arranged in order of decreasing bandgap. For example, in some implementations of a 4-junction structure, the bandgap of the first semiconductor layer is lower than the bandgap of the second semiconductor layer, the bandgap of the second semiconductor layer is lower than the bandgap of the third semiconductor layer, and the bandgap of the third semiconductor layer is lower than the bandgap of the fourth semiconductor layer. Moreover, in some instances, the bandgap of a first semiconductor layer is between about 0.5 eV and about 1 eV. In some implementations, the bandgap of the first semiconductor layer is about 0.73 eV or less. For example, the bandgap of the first semiconductor layer can be about 0.68 eV. Further, in some implementations, a second semiconductor layer has a bandgap between about 1.3 eV and about 1.5 eV, a third semiconductor layer has a bandgap between about 1.6 eV and about 1.7 eV, and a fourth semiconductor layer has a bandgap between about 1.8 eV and about 2 eV. Other arrangements are also possible, as understood by one of ordinary skill in the art.

II. Optoelectronic Devices

In another aspect, optoelectronic devices are described herein. An optoelectronic device described herein, in some implementations, comprises a first subcell comprising a first semiconductor layer, a second subcell comprising a second semiconductor layer, and a transparent metamorphic buffer layer disposed between the first semiconductor layer and the second semiconductor layer. The first semiconductor layer, the second semiconductor layer, and the buffer layer can comprise any first semiconductor layer, second semiconductor layer, and buffer layer described hereinabove in Section I. Thus, in some implementations, an optoelectronic device described herein comprises or incorporates a semiconductor structure described hereinabove in Section I. Any such semiconductor structure can be used.

In some implementations, for example, the first semiconductor layer of the first subcell of a device described herein has a first bandgap and a first lattice constant and the second semiconductor layer of the second subcell of the device has a second bandgap and a second lattice constant, wherein the second lattice constant is lower than the first lattice constant. In addition, in some cases, the second bandgap is higher than the first bandgap.

Further, in some implementations, the transparent metamorphic buffer layer of a device described herein has a constant or substantially constant bandgap and a varying lattice constant. The varying lattice constant of the buffer layer is matched to the first lattice constant adjacent the first semiconductor layer and matched to the second lattice constant adjacent the second semiconductor layer. Additionally, the buffer layer can comprise a first portion comprising or composed of $Al_yGa_zIn_{(1-y-z)}As$ and a second portion comprising or composed of $Ga_xIn_{(1-x)}P$. In some implementations, x can be zero and/or (y+z) can be 1. In other instances, x is non-zero and/or (y+z) is less than 1. The first portion is adjacent the first semiconductor layer and forms between about 2 percent and about 50 percent of the total thickness of the buffer layer. The second portion is adjacent the second semiconductor layer and forms between about 50 percent and about 98 percent of the total thickness of the buffer layer. Moreover, in some implementations, the buffer layer is transparent to electromagnetic radiation absorbable by the second subcell.

In addition, as described hereinabove in Section I, the chemical composition of a metamorphic buffer layer described herein can vary within the layer. For example, in some cases, the In content of a first portion of the buffer layer increases from the second semiconductor layer to the first semiconductor layer. Further, in some implementations having such a composition, the Al content of the first portion of the buffer layer also increases from the second semiconductor layer to the first semiconductor layer. Moreover, it is also possible for the bandgap of the first portion of a buffer layer having such a configuration to be constant or substantially constant throughout the compositional gradient.

Similarly, in some cases, a first portion of a buffer layer described herein can comprise a plurality of compositionally graded steps composed of $Al_yGa_zIn_{(1-y-z)}As$ and a second portion of the buffer layer can comprise a plurality of compositionally graded steps composed of $Ga_xIn_{(1-x)}P$. In some implementations, x can be zero and/or (y+z) can be 1. In other instances, x is non-zero and/or (y+z) is less than 1. In some cases, one of the plurality of $Al_yGa_zIn_{(1-y-z)}As$ steps is immediately adjacent one of the plurality of $Ga_xIn_{(1-x)}P$ steps, and the immediately adjacent $Al_yGa_zIn_{(1-y-z)}As$ and $Ga_xIn_{(1-x)}P$ steps have the same lattice constant. Further, in some cases, one or both of the immediately adjacent $Al_yGa_zIn_{(1-y-z)}As$ and $Ga_xIn_{(1-x)}P$ steps has a thickness of at least about 0.2 µm. Other thicknesses are also possible. For instance, in some implementations, one or both of the immediately adjacent $Al_yGa_zIn_{(1-y-z)}As$ and $Ga_xIn_{(1-x)}P$ steps has a thickness of at least about 0.4 µm or a thickness between about 0.2 µm and about 10 µm or between about 0.2 µm and about 1 µm. In addition, in some implementations, the second portion of the buffer layer comprises a $Ga_xIn_{(1-x)}P$ step having a lattice constant greater than the lattice constant of the immediately adjacent $Al_yGa_zIn_{(1-y-z)}As$ and $Ga_xIn_{(1-x)}P$ steps. Further, this $Ga_xIn_{(1-x)}P$ step can be positioned closer to the second semiconductor layer than the immediately adjacent $Al_yGa_zIn_{(1-y-z)}As$ and $Ga_xIn_{(1-x)}P$ steps are. Moreover, in some implementations, the $Ga_xIn_{(1-x)}P$ step having a lattice constant greater than the lattice constant of the immediately adjacent $Al_yGa_zIn_{(1-y-z)}As$ and $Ga_xIn_{(1-x)}P$ steps and positioned closer to the second semiconductor layer than the immediately adjacent $Al_yGa_zIn_{(1-y-z)}As$ and $Ga_xIn_{(1-x)}P$ steps is an InP step. Further, in some cases, the smallest lattice constant present in the first portion of a buffer layer described herein is less than or equal to the lattice constant of InP.

Additionally, in some implementations, an optoelectronic device described herein further comprises a substrate and the first portion of the buffer layer compensates for between about 5 percent and about 15 percent of the lattice mismatch between the substrate and the first semiconductor layer. In some cases, the first portion of the buffer layer compensates for about 10 percent of the lattice mismatch between the substrate and the first semiconductor layer. Moreover, in some instances, the lattice mismatch between the substrate and the first semiconductor layer is between about 2 percent and about 6 percent or between about 3 percent and about 5 percent.

Moreover, in some implementations, an optoelectronic device described herein further comprises one or more additional components or layers, such as one more additional subcells and/or one or more additional metamorphic buffer layers. For instance, in some cases, a device further comprises a third subcell. The third subcell comprises a third semiconductor layer having a third bandgap and a third lattice constant. The third semiconductor layer can have any of the features described hereinabove in Section I for a third semiconductor layer of a semiconductor structure. For example, in some cases, the third lattice constant is lower than the second lattice constant of the second semiconductor layer. In addition, in some implementations, the third bandgap is higher than the second bandgap.

In addition, a second transparent metamorphic buffer layer can be disposed between the second semiconductor layer of the second subcell and the third semiconductor layer of the third subcell. The buffer layer has a constant or substantially constant bandgap and a varying lattice constant, the varying lattice constant being matched to the second lattice constant adjacent the second semiconductor layer and matched to the third lattice constant adjacent the third semiconductor layer.

Further, the second buffer layer can have any of the features described hereinabove in Section I for a second buffer layer of a semiconductor structure. For example, in some cases, the second buffer layer comprises or is formed from $Ga_xIn_{(1-x)}P$ or $Al_xIn_yGa_{(1-x-y)}As$. Moreover, in some instances, the second buffer layer has a composition similar or analogous to the first metamorphic buffer layer of an optoelectronic device described herein.

Similarly, in some implementations, an optoelectronic device described herein further comprises a fourth subcell. The fourth subcell comprises a fourth semiconductor layer having a fourth bandgap and a fourth lattice constant. The fourth semiconductor layer can have any of the features described hereinabove in Section I for a fourth semiconductor layer of a semiconductor structure. For example, in some cases, the fourth lattice constant is the same or substantially the same as the third lattice constant of the third semiconductor layer. In addition, in some implementations, the fourth bandgap is higher than the third bandgap.

Moreover, one or more of the first, second, third, and fourth semiconductor layers of a device described herein can comprise a base portion and an emitter portion, the base portion and emitter portion forming a p-n junction. Thus, in some implementations, a device described herein can be a multijunction device, including a 4-junction device. Other multijunction devices are also possible. For instance, any number of subcells and/or semiconductor layers described herein can be used to form any number of junctions not inconsistent with the objectives of the present disclosure. Thus, if desired, a device described herein can be a 3-junction, 4-junction, 5-junction, 6-junction, or 7-junction device and can comprise 3, 4, 5, 6, or 7 subcells. In addition, in some implementations, a device described herein is an inverted metamorphic device such as an inverted metamorphic multijunction solar cell.

Further, as described hereinabove in Section I for semiconductor structures, semiconductor layers of an optoelectronic device described herein can comprise or be formed from any materials and can have any bandgap not inconsistent with the objectives of the present disclosure. In some implementations, one or more semiconductor layers described herein comprise or are formed from a III-V material, II-VI material, or Group IV material, including any material described hereinabove in Section I. In some implementations, for example, the first semiconductor layer and/or the second semiconductor layer of an optoelectronic device described herein comprises or is formed from $Ga_xIn_{(1-x)}As$.

Additionally, in some cases, the chemical composition of a semiconductor layer is selected based on a desired bandgap of the layer, as described hereinabove in Section I. Moreover, any combination of bandgaps not inconsistent with the objectives of the present disclosure can be used in an optoelectronic device described herein. In some implementations, the bandgaps of the semiconductor layers are arranged in the subcells of the device in order of increasing bandgap, moving from the top to the bottom of the device. Alternatively, in other cases, the bandgaps are arranged in order of decreasing bandgap. For example, in some implementations of a 4-junction device, the bandgap of the first semiconductor layer is lower than the bandgap of the second semiconductor layer, the bandgap of the second semiconductor layer is lower than the bandgap of the third semiconductor layer, and the bandgap of the third semiconductor layer is lower than the bandgap of the fourth semiconductor layer. Moreover, in some instances, the bandgap of a first semiconductor layer is between about 0.5 eV and about 1 eV.

Further, in some implementations, a second semiconductor layer has a bandgap between about 1.3 eV and about 1.5 eV, a third semiconductor layer has a bandgap between about 1.6 eV and about 1.7 eV, and a fourth semiconductor layer has a bandgap between about 1.8 eV and about 2 eV. Other arrangements are also possible, as understood by one of ordinary skill in the art.

An optoelectronic device described herein can also comprise one or more additional components or layers in addition to one or more additional subcells or buffer layers. For example, in some implementations, an optoelectronic device comprises one or more substrate layers, cap layers, window layers, tunnel junction layers, back-surface field (BSF) layers, and/or etch stop layers. Such layers can have any configuration and be formed from any material not inconsistent with the objectives of the present disclosure. For example, in some implementations, a substrate layer, a cap layer, window layer, tunnel junction layer, BSF layer, and/or etch stop layer comprises or is formed from a III-V material, II-VI material, or Group IV material, including any material described hereinabove in Section I.

Some non-limiting implementations of optoelectronic devices will now be further described with reference to the figures. FIG. 1 illustrates a cross-sectional view of an optoelectronic device according to one implementation described herein. The various components of the optoelectronic device are not necessarily drawn to scale in FIG. 1. Optoelectronic device (1000) comprises a first subcell (1100) comprising a first semiconductor layer (1110), a second subcell (1200) comprising a second semiconductor layer (1210), and a transparent metamorphic buffer layer (1300) disposed between the first semiconductor layer (1110) and the second semiconductor layer (1210). As illustrated in FIG. 1, the first semiconductor layer (1110) comprises a base portion (1111) and an emitter portion (1112), and the second semiconductor layer (1210) comprises a p-type base portion (1211) and an n-type emitter portion (1212). However, other configurations of the semiconductor layers (1110, 1210) are also possible.

The buffer layer (1300) comprises a first portion (1310) composed of $Al_yGa_zIn_{(1-y-z)}As$ and a second portion (1320) composed of $Ga_xIn_{(1-x)}P$. The first portion (1310) is adjacent the first semiconductor layer (1110). The second portion (1320) is adjacent the second semiconductor layer (1210). As illustrated in FIG. 1, the first portion (1310) and the second portion (1320) are not immediately adjacent the first semiconductor layer (1110) and the second semiconductor layer (1210), respectively. Instead, various window and tunnel junction layers are disposed in between. However, other implementations are also possible, as understood by one of ordinary skill in the art.

The device of FIG. 1 also comprises a third subcell (1400). The third subcell (1400) comprises a third semiconductor layer (1410). The third semiconductor layer (1410) comprises a p-type base portion (1411) and an n-type emitter portion (1412). In addition, a second transparent metamorphic buffer layer (1500) is disposed between the second semiconductor layer (1210) of the second subcell (1200) and the third semiconductor layer (1410) of the third subcell (1400). The buffer layer (1500) has a step-graded composition.

Further, the device (1000) also comprises a fourth subcell (1600) and a substrate (1700). The fourth subcell (1600) comprises a fourth semiconductor layer (1610). The fourth semiconductor layer (1610) comprises a p-type base portion (1611) and an n-type emitter portion (1612).

Figure 2:
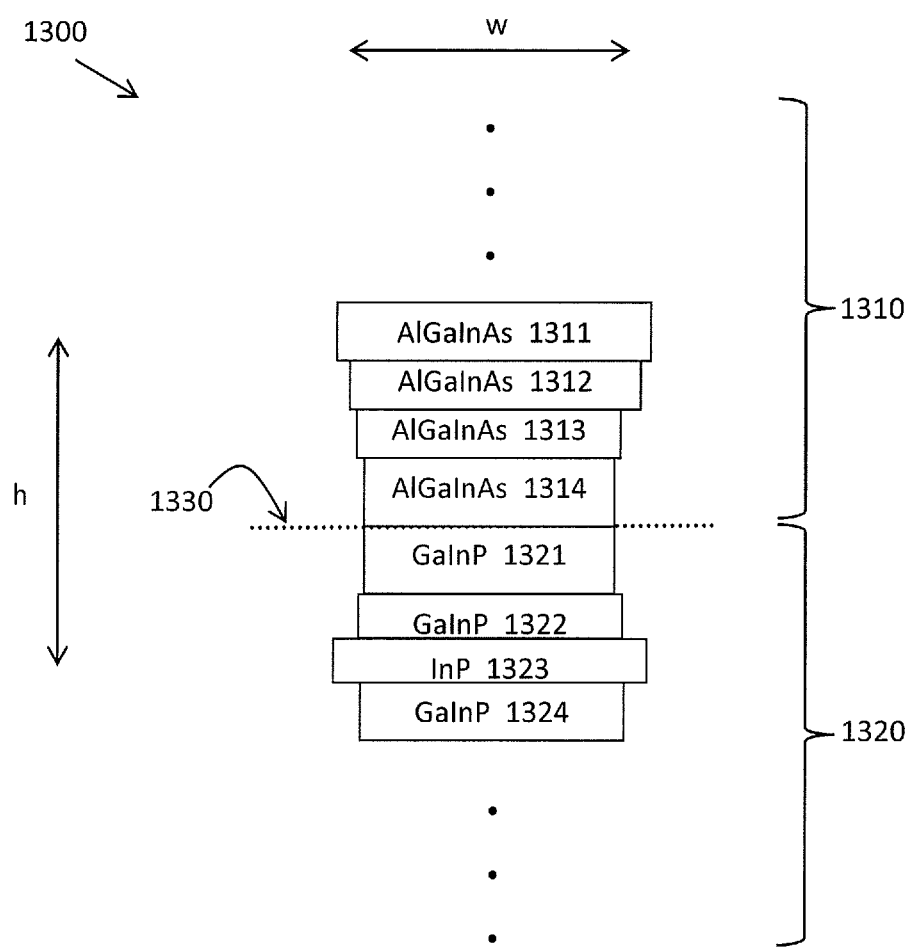
FIG. 2 illustrates a schematic view of a portion of the optoelectronic device of FIG. 1.

FIG. 2 illustrates a portion of the first buffer layer (1300) of the device (1000) of FIG. 1 in more detail. It should be noted that this portion of the buffer layer (1300) is illustrated schematically. Specifically, the width (in direction w) of each of the steps in FIG. 2 corresponds to the relative lattice constant of the step, not the physical dimension of the step. Thus, a step depicted as a wider step has a larger lattice constant, and a step depicted as a narrower step has a smaller lattice constant. The height (in direction h) of each step corresponds to the relative thickness of the step as grown. Thus, a taller step is a thicker step (e.g., 0.2 µm thick), and a shorter step is a thinner step (e.g., 0.1 µm thick). In addition, the dotted lines in FIG. 2 represent additional steps of the buffer layer (1300) that are not specifically depicted.

As illustrated in FIG. 2, the buffer layer (1300) comprises a material switching interface (1330) in between the first portion (1310) and the second portion (1320) of the buffer layer (1300). The material switching interface (1330) marks a transition from the P-containing second portion (1320) to the As-containing first portion (1310). The first portion (1310) of the buffer layer (1300) comprises a plurality of compositionally graded steps (1311, 1312, 1313, 1314) composed of $Al_yGa_zIn_{(1-y-z)}As$. The second portion (1320) of the buffer layer (1300) comprises a plurality of compositionally graded steps (1321, 1322, 1323, 1324) composed of $Ga_xIn_{(1-x)}P$. One $Al_yGa_zIn_{(1-y-z)}As$ step (1314) of the plurality of $Al_yGa_zIn_{(1-y-z)}As$ steps is immediately adjacent one $Ga_xIn_{(1-x)}P$ step (1321) of the plurality of $Ga_xIn_{(1-x)}P$ steps, and the immediately adjacent $Al_yGa_zIn_{(1-y-z)}As$ and $Ga_xIn_{(1-x)}P$ steps (1314, 1321, respectively) have the same lattice constant. Further, as illustrated in FIG. 2, both of the immediately adjacent $Al_yGa_zIn_{(1-y-z)}As$ and $Ga_xIn_{(1-x)}P$ steps (1314, 1321, respectively) are thicker than the various other $Al_yGa_zIn_{(1-y-z)}As$ and $Ga_xIn_{(1-x)}P$ steps (1311, 1312, 1313, 1322, 1323, 1324) of the buffer layer (1300). In addition, in the implementation of FIG. 2, the second portion (1320) of the buffer layer (1300) comprises a $Ga_xIn_{(1-x)}P$ step (1323), wherein x=0) having a lattice constant greater than the lattice constant of the immediately adjacent $Al_yGa_zIn_{(1-y-z)}As$ and $Ga_xIn_{(1-x)}P$ steps (1314, 1321, respectively). This $Ga_xIn_{(1-x)}P$ step (1323) is positioned closer to the second semiconductor layer (not shown) than the immediately adjacent $Al_yGa_zIn_{(1-y-z)}As$ and $Ga_xIn_{(1-x)}P$ steps (1314, 1321, respectively) are.

Further, it should be noted that, as described further in Section I hereinabove, the second portion (1320) of the buffer layer (1300) can alternatively comprise a plurality of compositionally graded steps composed of $Al_aGa_bIn_{(1-a-b)}P$. For example, in some implementations, one or more of the $Ga_xIn_{(1-x)}P$ steps (1321, 1322, and 1324) in FIG. 2 can be replaced with a step composed of $Al_aGa_bIn_{(1-a-b)}P$, wherein a can be non-zero if desired.

It has been surprisingly found that, in some cases, a buffer layer having the structure of the implementation of FIG. 2 can allow the first portion of the buffer layer to be relatively thin without introducing an undue roughness or a large number of defects at the material switching interface. However, as understood by one of ordinary skill in the art, an optoelectronic device described herein can also have other configurations in addition to that illustrated in FIG. 1 and FIG. 2.

III. Methods of Making an Optoelectronic Device

In another aspect, methods of making an optoelectronic device are described herein. A method described herein can be used to form any optoelectronic device described hereinabove in Section II. In some implementations, a method of making an optoelectronic device described herein comprises providing a substrate, disposing a first subcell comprising a first semiconductor layer above the substrate, disposing a second subcell comprising a second semiconductor layer above the substrate, and disposing a transparent metamorphic buffer layer between the first semiconductor layer and the second semiconductor layer. The first semiconductor layer has a first bandgap and a first lattice constant. The second semiconductor layer has a second bandgap and a second lattice constant, the second lattice constant being lower than the first lattice constant. Further, the first subcell is stacked above the second subcell and positioned farther from the substrate than the second subcell is from the substrate. The transparent metamorphic buffer layer has a constant or substantially constant bandgap and a varying lattice constant, the varying lattice constant being matched to the first lattice constant adjacent the first semiconductor layer and matched to the second lattice constant adjacent the second semiconductor layer. Moreover, the buffer layer comprises a first portion comprising or composed of $Al_yGa_zIn_{(1-y-z)}As$ and a second portion comprising or composed of $Ga_xIn_{(1-x)}P$. In some implementations, x can be zero and/or (y+z) can be 1. In other instances, x is non-zero and/or (y+z) is less than 1. The first portion is adjacent the first semiconductor layer and forms between about 2 percent and about 50 percent of the total thickness of the buffer layer, and the second portion is adjacent the second semiconductor layer and forms between about 50 percent and about 98 percent of the total thickness of the buffer layer.

The first subcell, second subcell, first semiconductor layer, second semiconductor layer, and transparent metamorphic buffer layer provided in a method described herein can have any of the structures, configurations, or features of a first subcell, second subcell, first semiconductor layer, second semiconductor layer, and transparent metamorphic buffer layer described hereinabove in Sections I and II. For example, in some cases, a first portion of a buffer layer of a method described herein compensates for between about 5 percent and about 15 percent of the lattice mismatch between the substrate and the first semiconductor layer. Similarly, in some implementations, the first portion of the buffer layer comprises a plurality of compositionally graded step comprising or composed of $Al_yGa_zIn_{(1-y-z)}As$ and the second portion of the buffer layer comprises a plurality of compositionally graded steps comprising or composed of $Ga_xIn_{(1-x)}P$, wherein one of the plurality of $Al_yGa_zIn_{(1-y-z)}As$ steps is immediately adjacent one of the plurality of $Ga_xIn_{(1-x)}P$ steps, the immediately adjacent $Al_yGa_zIn_{(1-y-z)}As$ and $Ga_xIn_{(1-x)}P$ steps having the same lattice constant.

Moreover, in some implementations, a method described herein further comprises providing one or more additional subcells. For example, in some cases, a method further comprises disposing a third subcell above the substrate and below the second subcell and disposing a second transparent metamorphic buffer layer between the second semiconductor layer and the third semiconductor layer. The third subcell comprises a third semiconductor layer having a third bandgap and a third lattice constant, the third lattice constant being lower than the second lattice constant. The buffer layer has a constant or substantially constant bandgap and a varying lattice constant. The varying lattice constant is matched to the second lattice constant adjacent the second semiconductor layer and matched to the third lattice constant adjacent the third semiconductor layer.

Further, the third subcell and the second buffer layer can comprise any third subcell and second buffer layer described hereinabove in Section II. For example, in some instances, the second metamorphic layer comprises or is formed from $Ga_xIn_{(1-x)}P$ or $Al_xIn_yGa_{(1-x-y)}As$. In some implementations, the second metamorphic buffer layer has a composition similar or analogous to the first metamorphic buffer layer.

In addition, in some instances, a method described herein further comprises disposing a fourth subcell above the substrate and below the third subcell. The fourth subcell comprises a fourth semiconductor layer having a fourth bandgap and a fourth lattice constant. The fourth semiconductor layer can have any of the features described hereinabove in Section II for a fourth semiconductor layer of an optoelectronic device. For example, in some cases, the fourth lattice constant is the same or substantially the same as the third lattice constant of the third semiconductor layer. In addition, in some implementations, the fourth bandgap is higher than the third bandgap.

Moreover, one or more of the first, second, third, and fourth semiconductor layers of a device made by a method described herein can comprise a base portion and an emitter portion, the base portion and emitter portion forming a p-n junction. Thus, in some implementations, a device made by a method described herein can be a multijunction device, including a 4-junction device. Other multijunction devices can also be provided by a method described herein. For instance, any number of subcells and/or semiconductor layers described herein can be used to form any number of junctions not inconsistent with the objectives of the present disclosure. Thus, if desired, a device made by a method described herein can be a 3-junction, 4-junction, 5-junction, 6-junction, or 7-junction device. In addition, in some implementations, a method described herein can be used to provide an inverted metamorphic device such as an inverted metamorphic multijunction solar cell.

For instance, in some cases, the first subcell of a 4-junction device made by a method described herein is the top subcell of the device, and the fourth subcell is the bottom subcell of the device. In other instances, the first subcell is the bottom subcell, and the fourth subcell is the top subcell. Further, in a method described herein, the first subcell can be the last subcell grown to provide the device, and the fourth subcell can be the first subcell grown to provide the device. Thus, in some cases, the first subcell is disposed after the second subcell and first metamorphic buffer layer are provided. More generally, in some implementations, sunward subcells or semiconductor layers can be grown before layers away from sun. Alternatively, in other cases, sunward subcells or layers can be grown after layers away from the sun.

Further, as described hereinabove in Section II for optoelectronic devices, semiconductor layers of an optoelectronic device made by a method described herein can comprise or be formed from any material and can have any bandgap not inconsistent with the objectives of the present disclosure. In some implementations, one or more semiconductor layers described herein comprise or are formed from a III-V material, II-VI material, or Group IV material, including any material described hereinabove in Section I. In some implementations, for example, the first semiconductor layer and/or the second semiconductor layer of an optoelectronic device formed by a method described herein comprises or is formed from $Ga_xIn_{(1-x)}As$.

Additionally, in some cases, the chemical composition of a semiconductor layer is selected based on a desired bandgap of the layer, as described hereinabove in Section I. Moreover, any combination of bandgaps not inconsistent with the objectives of the present disclosure can be used in an optoelectronic device formed by a method described herein. In some implementations, the bandgaps of the semiconductor layers are arranged in the subcells of the device in order of increasing bandgap, moving from the top to the bottom of the device. Alternatively, in other cases, the bandgaps are arranged in order of decreasing bandgap. For example, in some implementations of a 4-junction device, the bandgap of the first semiconductor layer is lower than the bandgap of the second semiconductor layer, the bandgap of the second semiconductor layer is lower than the bandgap of the third semiconductor layer, and the bandgap of the third semiconductor layer is lower than the bandgap of the fourth semiconductor layer. Moreover, in some instances, the bandgap of a first semiconductor layer is between about 0.5 eV and about 1 eV. Further, in some implementations, a second semiconductor layer has a bandgap between about 1.3 eV and about 1.5 eV, a third semiconductor layer has a bandgap between about 1.6 eV and about 1.7 eV, and a fourth semiconductor layer has a bandgap between about 1.8 eV and about 2 eV. Other arrangements are also possible, as understood by one of ordinary skill in the art.

In addition, in some implementations, a method described herein can further comprise providing one or more additional layers in addition to one or more additional subcells or buffer layers. For example, in some instances, a method described herein further comprises providing one or more cap layers, window layers, tunnel junction layers, BSF layers, and/or etch stop layers. Such layers can have any configuration and be formed from any material not inconsistent with the objectives of the present disclosure. For example, in some implementations, a cap layer, window layer, tunnel junction layer, BSF layer, and/or etch stop layer comprises or is formed from a III-V material, II-VI material, or Group IV material, including any material described hereinabove in Section I.

Moreover, in some cases, a method described herein further comprises removing the substrate following formation of the subcells of the device. Removal of the substrate on the sunward side of the device, in some implementations, can permit incident electromagnetic radiation to enter the sunward subcell. Removal of the substrate on the side away from the source of incident electromagnetic radiation, in some cases, can provide a reduced device weight, an improved device flexibility, better thermal transfer, and/or lower cost through substrate reuse.

Providing or disposing various layers of a device can be carried out in any manner not inconsistent with the objectives of the present disclosure. For example, one or more layers may be grown by an epitaxial semiconductor growth process, such as metal-organic vapor-phase epitaxy (MOVPE), molecular beam epitaxy (MBE), metal-organic molecular beam epitaxy (MOMBE), liquid phase epitaxy (LPE), or vapor phase epitaxy (VPE). Further, such epitaxial processes can be carried out at any pressure and using any precursors not inconsistent with the objectives of the present disclosure. In some implementations, for instance, an epitaxial process is carried out at atmospheric pressure or at a pressure between about 1 Torr and about 1000 Torr. Further, in some cases, one or more of arsine, phosphine, trimethylgallium, triethylgallium, trimethylindium, triethylindium, trimethylaluminum, triethylaluminum, hydrogen selenide, disilane, and diethylzinc can be used as precursors and/or dopant gases.

Physical vapor deposition (PVD), chemical vapor deposition (CVD), plasma-enhanced chemical vapor deposition (PECVD), and/or low-pressure chemical vapor deposition (LPCVD) may also be used to provide a layer of an optoelectronic device described herein. In addition, in some implementations, one or more layers of an optoelectronic device can be provided by a process comprising evaporation, sputtering, screen printing, spray coating, spin coating, doctor blade application, surface wetting by a liquid, electroless plating, electroplating, photolithography, shadow mask deposition, isotropic etching, composition-selective etching, orientation-selective etching, directionally-selective etching, photopatterning of a resist layer followed by etching a layer of the device, photopatterning of a first layer of the device followed by etching a second layer of the device using the patterned first layer as an etch mask in a self-aligned process, photopatterning of a resist layer followed by deposition of a material and dissolution of the resist layer to remove part of the deposited material in a liftoff process, and/or photopatterning of a photosensitive layer that is a layer of the device.

In addition, in some implementations, one or more subcells can be grown on separate growth substrates and later joined together. Such subcells can be joined in any manner not inconsistent with the objectives of the present disclosure. In some cases, one or more bonding structures are used. Non-limiting examples of bonding structures include a transparent adhesive combined with a patterned metal conductor or interconnect; a transparent adhesive combined with a patterned or unpatterned transparent conductor; a transparent inorganic layer such as an inorganic oxide or nitride layer combined with a patterned metal conductor; a transparent inorganic layer combined with a patterned or unpatterned transparent conductor; and a transparent conductive coating comprising zinc oxide and/or or indium tin oxide. If desired, subcells may also be joined using a direct semiconductor-to-semiconductor bonding process, as understood by one of ordinary skill in the art. In some instances, a semiconductor-to-semiconductor bond is atomically abrupt, with the transition from one semiconductor to the other taking place within 1 to 10 monolayers of the crystal lattice.

Methods of making an optoelectronic device described herein, in some implementations, can be used to provide one or more advantages. For example, a method described herein can reduce the thermal load of an optoelectronic device made by the method. Thus, methods of reducing the thermal load of a device are described herein. In some implementations, for example, a method of reducing the thermal load of an inverted metamorphic multijunction solar cell is described, the method comprising carrying out a method of making an optoelectronic device described herein. Further, reducing the thermal load of a device can improve the efficiency of the device, such as the external quantum efficiency (EQE) of the device. Therefore, methods of improving the EQE of an optoelectronic device are described herein. In some implementations, for example, a method of improving the external quantum efficiency of an inverted metamorphic multijunction solar cell is described, the method comprising carrying out a method of making an optoelectronic device described herein.

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. A semiconductor structure comprising:
   a first semiconductor layer having a first bandgap and a first lattice constant;
   a second semiconductor layer having a second bandgap and a second lattice constant, the second lattice constant being lower than the first lattice constant; and
   a transparent metamorphic buffer layer disposed between the first semiconductor layer and the second semiconductor layer, the transparent metamorphic buffer layer having a constant or substantially constant bandgap and a varying lattice constant, the varying lattice constant being matched to the first lattice constant adjacent the first semiconductor layer and matched to the second lattice constant adjacent the second semiconductor layer,
   wherein the transparent metamorphic buffer layer comprises a first portion comprising $Al_yGa_zIn_{(1-y-z)}As$ and a second portion comprising $Ga_xIn_{(1-x)}P$, the first portion being adjacent the first semiconductor layer and forming between 2 percent and 50 percent of the total thickness of the transparent metamorphic buffer layer, and the second portion being adjacent the second semiconductor layer and forming between 50 percent and 98 percent of the total thickness of the transparent metamorphic buffer layer, and
   wherein the second portion of the transparent metamorphic buffer layer comprises at least three compositionally graded steps comprising $Ga_xIn_{(1-x)}P$.

2. The structure of claim 1, wherein an In content of the first portion of the transparent metamorphic buffer layer increases from the second semiconductor layer to the first semiconductor layer.

3. The structure of claim 2, wherein an Al content of the first portion of the transparent metamorphic buffer layer increases from the second semiconductor layer to the first semiconductor layer and a bandgap of the first portion of the transparent metamorphic buffer layer is constant or substantially constant.

4. The structure of claim 1, wherein the first portion of the transparent metamorphic buffer layer forms between 5 percent and 40 percent of a total thickness of the transparent metamorphic buffer layer.

5. The structure of claim 1, wherein the first portion of the transparent metamorphic buffer layer compensates for at least 3 percent of a lattice mismatch between the first lattice constant and the second lattice constant.

6. The structure of claim 1, wherein the first portion of the transparent metamorphic buffer layer comprises a plurality of compositionally graded steps comprising $Al_yGa_zIn_{(1-y-z)}As$, and wherein one of the plurality of $Al_yGa_zIn_{(1-y-z)}As$ steps is immediately adjacent one of the plurality of $Ga_xIn_{(1-x)}P$ steps defining immediately adjacent $Al_yGa_zIn_{(1-y-z)}As$ and $Ga_xIn_{(1-x)}P$ steps, the immediately adjacent $Al_yGa_zIn_{(1-y-z)}As$ and $Ga_xIn_{(1-x)}P$ steps having a same lattice constant.

7. The structure of claim 6, wherein one or both of the immediately adjacent $Al_yGa_zIn_{(1-y-z)}As$ and $Ga_xIn_{(1-x)}P$ steps has a thickness of at least 0.2 μm.

8. The structure of claim 6, wherein the second portion of the transparent metamorphic buffer layer comprises a $Ga_xIn_{(1-x)}P$ step having a lattice constant greater than the same lattice constant of the immediately adjacent $Al_yGa_zIn_{(1-y-z)}As$ and $Ga_xIn_{(1-x)}P$ steps and positioned closer to the second semiconductor layer than the immediately adjacent $Al_yGa_zIn_{(1-y-z)}As$ and $Ga_xIn_{(1-x)}P$ steps are.

9. The structure of claim 1, wherein the first bandgap is 0.73 eV or less.

10. The structure of claim 1, wherein the second bandgap is higher than the first bandgap.

11. The structure of claim 1 further comprising:
    a third semiconductor layer having a third bandgap and a third lattice constant, the third lattice constant being lower than the second lattice constant; and
    a second transparent metamorphic buffer layer disposed between the second semiconductor layer and the third semiconductor layer, the second transparent metamorphic buffer layer having a constant or substantially constant bandgap and a varying lattice constant, the varying lattice constant being matched to the second lattice constant adjacent the second semiconductor layer and matched to the third lattice constant adjacent the third semiconductor layer.

12. The structure of claim 11, wherein the third bandgap is higher than the second bandgap.

13. An optoelectronic device comprising:
    a first subcell comprising a first semiconductor layer having a first bandgap and a first lattice constant;
    a second subcell comprising a second semiconductor layer having a second bandgap and a second lattice constant, the second lattice constant being lower than the first lattice constant; and
    a transparent metamorphic buffer layer disposed between the first semiconductor layer and the second semiconductor layer, the transparent metamorphic buffer layer having a constant or substantially constant bandgap and a varying lattice constant, the varying lattice constant being matched to the first lattice constant adjacent the first semiconductor layer and matched to the second lattice constant adjacent the second semiconductor layer,
    wherein the transparent metamorphic buffer layer comprises a first portion comprising $Al_yGa_zIn_{(1-y-z)}As$ and a second portion comprising $Ga_xIn_{(1-x)}P$, the first portion being adjacent the first semiconductor layer and forming between 2 percent and 50 percent of the total thickness of the transparent metamorphic buffer layer, and the second portion being adjacent the second semiconductor layer and forming between 50 percent and 98 percent of the total thickness of the transparent metamorphic buffer layer, and
    wherein the second portion of the transparent metamorphic buffer layer comprises at least three compositionally graded steps each comprising $Ga_xIn_{(1-x)}P$.

14. The device of claim 13, wherein an In content and an Al content of the first portion of the transparent metamorphic buffer layer both increase from the second semiconductor layer to the first semiconductor layer and a bandgap of the first portion of the transparent metamorphic buffer layer is constant or substantially constant.

15. The device of claim 13, wherein the device further comprises a substrate and the first portion of the transparent metamorphic buffer layer compensates for between 5 percent and 15 percent of a lattice mismatch between the substrate and the first semiconductor layer.

16. The device of claim 13, wherein the first portion of the transparent metamorphic buffer layer comprises a plurality of compositionally graded steps comprising $Al_yGa_zIn_{(1-y-z)}As$, and wherein one of the plurality of $Al_yGa_zIn_{(1-y-z)}As$ steps is immediately adjacent one of the plurality of $Ga_xIn_{(1-x)}P$ steps defining immediately adjacent $Al_yGa_zIn_{(1-y-z)}$ As and $Ga_xIn_{(1-x)}P$ steps, the immediately adjacent $Al_yGa_zIn_{(1-y-z)}As$ and $Ga_xIn_{(1-x)}P$ steps having a same lattice constant.

17. The device of claim 13, wherein the transparent metamorphic buffer layer is transparent to electromagnetic radiation absorbable by the second subcell.

18. The device of claim 13 further comprising:
a third subcell comprising a third semiconductor layer having a third bandgap and a third lattice constant, the third lattice constant being lower than the second lattice constant; and
a second transparent metamorphic buffer layer disposed between the second semiconductor layer and the third semiconductor layer, the second transparent metamorphic buffer layer having a constant or substantially constant bandgap and a varying lattice constant, the varying lattice constant being matched to the second lattice constant adjacent the second semiconductor layer and matched to the third lattice constant adjacent the third semiconductor layer.

19. The device of claim 18, wherein the third bandgap is higher than the second bandgap.

20. The device of claim 18 further comprising:
a fourth subcell comprising a fourth semiconductor layer having a fourth bandgap and a fourth lattice constant, the fourth lattice constant being the same or substantially the same as the third lattice constant.

21. The device of claim 20, wherein the fourth bandgap is higher than the third bandgap.

22. The device of claim 13, wherein the device is an inverted metamorphic multijunction solar cell.

23. A method of making an optoelectronic device comprising:
providing a substrate;
disposing a first subcell above the substrate, the first subcell comprising a first semiconductor layer having a first bandgap and a first lattice constant;
disposing a second subcell above the substrate, the second subcell comprising a second semiconductor layer having a second bandgap and a second lattice constant, the second lattice constant being lower than the first lattice constant and the first subcell being stacked above the second subcell and positioned farther from the substrate than the second subcell is from the substrate; and
disposing a transparent metamorphic buffer layer between the first semiconductor layer and the second semiconductor layer, the transparent metamorphic buffer layer having a constant or substantially constant bandgap and a varying lattice constant, the varying lattice constant being matched to the first lattice constant adjacent the first semiconductor layer and matched to the second lattice constant adjacent the second semiconductor layer,
wherein the transparent metamorphic buffer layer comprises a first portion comprising $Al_yGa_zIn_{(1-y-z)}As$ and a second portion comprising $Ga_xIn_{(1-x)}P$, the first portion being adjacent the first semiconductor layer and forming between 2 percent and 50 percent of the total thickness of the transparent metamorphic buffer layer, and the second portion being adjacent the second semiconductor layer and forming between 50 percent and 98 percent of the total thickness of the transparent metamorphic buffer layer, and
wherein the second portion of the transparent metamorphic buffer layer comprises at least three compositionally graded steps each comprising $Ga_xIn_{(1-x)}P$.

24. The method of claim 23, wherein the first portion of the transparent metamorphic buffer layer compensates for between 5 percent and 15 percent of a lattice mismatch between the substrate and the first semiconductor layer.

25. The method of claim 23, wherein the second bandgap is higher than the first bandgap.

26. The method of claim 23 further comprising:
disposing a third subcell above the substrate and below the second subcell, the third subcell comprising a third semiconductor layer having a third bandgap and a third lattice constant, the third lattice constant being lower than the second lattice constant; and
disposing a second transparent metamorphic buffer layer between the second semiconductor layer and the third semiconductor layer, the second transparent metamorphic buffer layer having a constant or substantially constant bandgap and a varying lattice constant, the varying lattice constant being matched to the second lattice constant adjacent the second semiconductor layer and matched to the third lattice constant adjacent the third semiconductor layer.

27. The method of claim 26, wherein the third bandgap is higher than the second bandgap.

28. The method of claim 26 further comprising:
disposing a fourth subcell above the substrate and below the third subcell, the fourth subcell comprising a fourth semiconductor layer having a fourth bandgap and a fourth lattice constant, the fourth lattice constant being the same or substantially the same as the third lattice constant.

29. The method of claim 28, wherein the fourth bandgap is higher than the third bandgap.

* * * * *